(12) United States Patent
Tanaka

(10) Patent No.: US 8,018,035 B2
(45) Date of Patent: Sep. 13, 2011

(54) SEMICONDUCTOR DEVICE AND SEMICONDUCTOR INTEGRATED CIRCUIT

(75) Inventor: Yuji Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 311 days.

(21) Appl. No.: 12/453,499

(22) Filed: May 13, 2009

(65) Prior Publication Data

US 2009/0321904 A1 Dec. 31, 2009

(30) Foreign Application Priority Data

Jun. 27, 2008 (JP) .................................. 2008-169513

(51) Int. Cl.
*H01L 39/00* (2006.01)
*H01L 23/48* (2006.01)
(52) U.S. Cl. ......... 257/663; 257/662; 257/665; 257/773
(58) Field of Classification Search .................. 257/662, 257/663, 665, 773
See application file for complete search history.

(56) References Cited

U.S. PATENT DOCUMENTS

| | | | |
|---|---|---|---|
| 6,791,165 B2 * | 9/2004 | Barre et al. | 257/664 |
| 7,211,903 B2 * | 5/2007 | Miyaki et al. | 257/784 |

FOREIGN PATENT DOCUMENTS

| | | |
|---|---|---|
| JP | 09-027512 A | 1/1997 |
| JP | 2000-252363 | 9/2000 |
| JP | 2000-349192 A | 12/2000 |
| JP | 2001-244293 A | 9/2001 |
| JP | 2003-249904 A | 9/2003 |
| JP | 2005-191447 A | 7/2005 |
| JP | 2005-252095 | 9/2005 |

OTHER PUBLICATIONS

Japanese Office Action issued May 11, 2010 for corresponding Japanese Application No. 2008-169513.

* cited by examiner

*Primary Examiner* — Thanh V Pham
(74) *Attorney, Agent, or Firm* — Rader, Fishman & Grauer PLLC

(57) ABSTRACT

The present invention provides a semiconductor device, including: a semiconductor substrate having a circuit formed thereon; a mounting substrate cemented to a rear face of the semiconductor substrate; a plurality of pads arranged in a linearly juxtaposed relationship with each other in a direction perpendicular to a peripheral edge side of the semiconductor substrate which is nearest to the pads on a main face of the semiconductor substrate and electrically connected to the circuit in a corresponding relationship to a signal, a power supply voltage and a reference signal; a plurality of wires individually cemented at one end thereof to the pads; and a plurality of wire cemented elements formed on the mounting substrate and cemented to the other end of the wires.

13 Claims, 5 Drawing Sheets

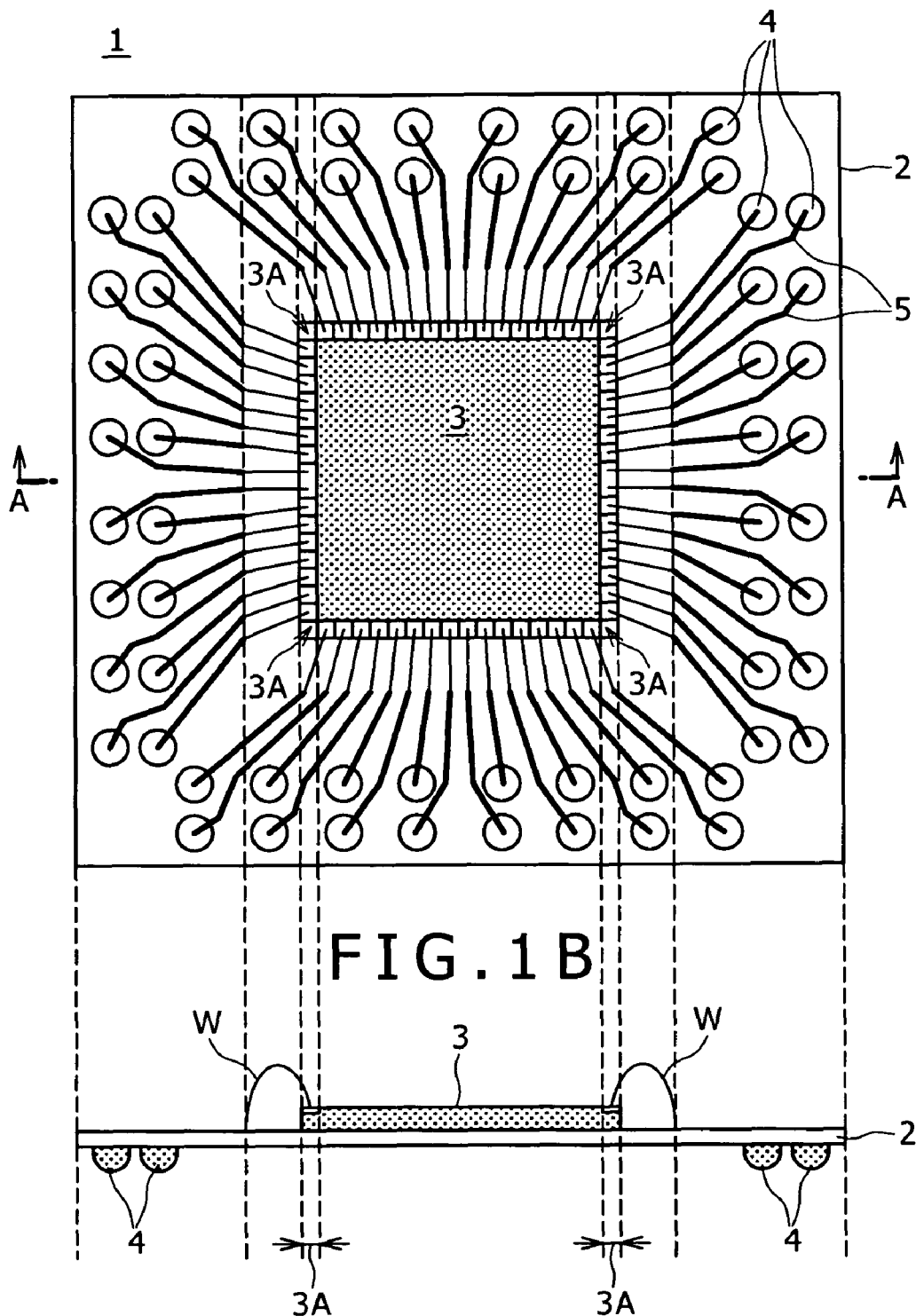

SEMICONDUCTOR DEVICE AND SEMICONDUCTOR INTEGRATED CIRCUIT

BACKGROUND OF THE INVENTION

1. Field of the Invention

This invention relates to a semiconductor device wherein a semiconductor substrate and a mounting substrate are bridged by a plurality of wires to establish connection for inputting and outputting a signal, a power supply voltage and a reference voltage between them. The presenting invention relates also to a semiconductor integrated circuit or semiconductor chip having a pad arrangement which can be applied suitably to a semiconductor device of the type described.

2. Description of the Related Art

A semiconductor integrated circuit or semiconductor chip has a plurality of pads disposed at peripheral portions of a chip main face thereof for inputting and outputting signals therethrough or supplying power therethrough.

In recent years, the region of a chip main face in which pads are to be disposed is running short.

Although this arises from several causes, it seems a first cause that the wiring bonding technique cannot follow up the refinement of the semiconductor process. The pad size necessary for wire bonding depends upon the assembly technique, particularly upon the specifications of the wiring bonding apparatus and so forth. Generally, it is difficult to reduce the wire diameter and a bonding portion while assuring the reliability. On the other hand, the area of a circuit formed on a semiconductor chip is reduced significantly by process refinement. Accordingly, the progress of the process technique makes fine working of a semiconductor device possible, and even where the size of a chip which implements the same function can be reduced, the pad size cannot be reduced extremely from restrictions in the assembly technique regarding wire bonding. As a result, where a semiconductor chip of the same function is downsized, the number of pads which can be disposed at peripheral portions of the semiconductor chip decreases.

Secondly, enhancement in function and performance of a semiconductor chip makes a cause of shortage of pads.

It is demanded to build various functions in a semiconductor chip, and as a result, the number of signals to be extracted to the outside of the semiconductor chip increases. For example, as a result of increase of the bit length of an external memory bus, there is a tendency that also the number of necessary pads relating to the memory increases.

Thirdly, speeding up of an interface between semiconductor chips makes a cause of shortage of pads.

In a high speed interface, power supply noise such as power supply-ground bounce must be suppressed. To this end, a greater number of power supply voltage pads and ground pads are required. Further, for high speed signal lines, ground pads for shielding are required. Therefore, the speeding up of the interface increases the required number of pads.

Against the pad shortage caused by such various causes as described above, such a solution as flip chip mounting is available. However, the adoption of a new mounting method such as flip chip mounting gives rise to a tendency that the cost required for the mounting such as a material cost increases. Also it is demanded to elongate the life of an existing apparatus for mounting which uses wire bonding to suppress the fabrication cost as far as possible.

In order to eliminate the shortage of pads for wire bonding or in order to suppress noise, various proposals have been made regarding the pad arrangement as disclosed, for example, in Japanese Patent Laid-Open No. 2000-252363 (hereinafter referred to as Patent Document 1) and Japanese Patent Laid-Open No. 2005-252095 (hereinafter referred to as Patent Document 2).

According to the technique disclosed in Patent Document 1, at least one of a power supply voltage pad and a ground pad is provided for each signal to be inputted to or outputted from the outside using an output (IO) buffer serving as an output stage of a circuit is provided. Patent Document 1 describes that power supply noise which is generated in the output buffer can be reduced. Further, signal pads, power supply voltage pads and ground pads are disposed in a row in a direction perpendicular to the scribe line of the chip. Therefore, even if such a noise countermeasure as described above is added, the number of pads juxtaposed in directions parallel to the outer periphery of the chip does not increase. Patent Document 1 describes that, if the outer shape of a chip is expanded, then the power supply noise can be reduced while suppressing increase of the chip size and reduction of the degree of integration.

Patent Document 2 discloses a pad arrangement wherein a plurality of pads are arranged in a direction perpendicular to a peripheral edge or scribe line of a chip similarly as in Patent Document 1. Particularly, the technique according to Patent Document 2 is characterized in that such a plurality of pads as described above are formed in different wiring line layers. This characteristic makes it possible to lead out, even where a large number of output (IO) buffers are disposed in high density, a pad can be led out to a peripheral edge portion of the chip in a one-by-one corresponding relationship from each of the IO buffers.

Further, Patent Document 2 shows a view of wire bonding in a direction taken along a cross section of a chip in the FIG. 6. According to the view, a wire is bonded on the chip side to a wiring line layer at a deep position from the surface of the chip such as in the first or second wiring line layer. Further, a bonded position of a wire to the mounting substrate side is defined by providing an offset on the mounting substrate. With this configuration, the wires can be prevented from contacting with each other.

SUMMARY OF THE INVENTION

In the technique disclosed in Patent Document 1, a terminal for the power supply or the ground, that is, a lead portion led out from a pad to a mounting substrate through a wire, is provided for each signal line. In a more detailed embodiment, pads for the signal, ground and power supply are disposed in order in a row perpendicular to a scribe line. On the other hand, on the mounting substrate side, across a bonding portion of a wire for the signal, a bonding location for the wire for the power supply and a bonding location for the wire for the ground are disposed on the opposite sides in a direction parallel to the scribe line.

It is considered that, since a power supply line and a ground line are provided in an associated relationship with a signal line, the configuration described has some effect on reduction of power supply noise in comparison with an alternative case wherein power supply lines or ground lines are disposed in low density.

In the technique of Patent Document 1, while pads are disposed in a line on the chip side, on the mounting substrate side, wire bonding portions are provided in a direction perpendicular to the pad row of the chip. Therefore, if a large number of such configurations as just described are provided in a neighboring relationship with each other, then the distance between wires becomes very short at some location, and if the driving frequency is high, power supply noise is liable to interfere with such signal lines. In other words, the combination of the pad arrangement on the chip side and the wire bonding portion arrangement on the mounting substrate side disclosed in Patent Document 1 does not take the possibility into consideration that crosstalk noise may be superposed on the signal lines through capacitive coupling between the wires.

Further, such arrangement of the pads and the wire bonding portions makes a cause of wire contact.

Meanwhile, Patent Document 2 discloses that, in order to prevent contact between wires, the position or depth of pads provided on a chip from the surface of the substrate is changed and an offset is provided on the mounting substrate to change the wire bonding portions.

It is considered that even such a configuration as just described is effective where only wire contact is taken into consideration.

However, Patent Document 2 relates to a technique for implementing high density mounting of a plurality of signal line leads by changing the height of the wires. Accordingly, Patent Document 2 discloses nothing of the power supply and the ground and does not take noise reduction from a signal into consideration at all.

Therefore, it is desirable to provide a semiconductor device which implements a wire connection structure by which, even where high density arrangement is adopted, crosstalk noise is less likely to be superposed on paths along which signals are inputted or outputted.

Also it is desirable to provide a semiconductor integrated circuit which can be used favorably in a semiconductor device of the type described.

According to an embodiment of the present invention, there is provided a semiconductor device including a semiconductor substrate having a circuit formed thereon, a mounting substrate cemented to a rear face of the semiconductor substrate, a plurality of pads arranged in a linearly juxtaposed relationship with each other in a direction perpendicular to a peripheral edge side of the semiconductor substrate which is nearest to the pads on a main face of the semiconductor substrate and electrically connected to the circuit in a corresponding relationship to a signal, a power supply voltage and a reference signal, a plurality of wires individually cemented at one end thereof to the pads, and a plurality of wire cemented elements formed on the mounting substrate and cemented to the other end of the wires, the signal pads for inputting and outputting the signal being arranged farthest from the peripheral edge side of the semiconductor substrate in each of rows of the pads in which the pads are juxtaposed linearly, the signal wire cemented elements for inputting and outputting the signal from among the wire cemented elements being arranged at a position on the mounting substrate which is positioned farther from the semiconductor substrate than the other wire cemented elements.

Preferably, the wires for connecting the pads and the wire cemented elements in a one-by-one corresponding relationship to each other bridge the pads and the wire cemented elements in different loop heights thereamong.

More preferably, the wires are arranged in different loop heights along a direction of an extension line of a straight line which interconnects the centers of the pads in each pad row.

Preferably, the power supply voltage pad, reference voltage pad and signal pad in each pad row are arranged in order from the side nearer to the peripheral edge side of the semiconductor substrate, and the power supply voltage wire cemented element, reference voltage wire cemented element and signal wire cemented element to be electrically connected to the power supply voltage pad, reference voltage pad and signal pad, respectively, in each pad row individually by wires are positioned so as to be farther in order from the peripheral edge side of the semiconductor substrate.

More preferably, the wires for connecting the pads and the wire cemented elements in a one-by-one corresponding relationship to each other bridge the pads and the wire cemented elements in different loop heights thereamong, and the wires for propagating the signal, reference potential and power supply voltage are arranged in a descending order of the loop height. More preferably, the wires are arranged in different loop heights along a direction of an extension line of a straight line which interconnects the centers of the pads in each pad row.

Preferably, a plurality of pad rows are arranged along the peripheral edge side of the semiconductor substrate, and the power supply voltage wire cemented elements and the reference voltage wire cemented elements are individually formed as a single belt-shaped conductive layer common to the plural pad rows on the mounting substrate.

More preferably, a plurality of pad rows are arranged along the peripheral edge side of the semiconductor substrate, and in the plural pad rows, a plurality of reference voltage pads are disposed at positions which surround three sides of one of the signal pads. More preferably, the signal wire cemented element is surrounded on the three sides thereof by the reference voltage wire cemented element formed from a single belt-shaped conductor layer and two branch portions branching from the reference voltage wire cemented element.

In the semiconductor device, the plural pads on the semiconductor substrate are arranged linearly in a direction perpendicular to a peripheral edge side of the semiconductor substrate. Meanwhile, the plural wire cemented elements on the mounting substrate have a difference in distance from the semiconductor substrate, that is, from the peripheral edge side. Particularly, in each pad row on the semiconductor substrate, the signal pad is positioned farthest from the peripheral edge side, and the corresponding signal wire cemented element on the mounting substrate is arranged at the position farther from the semiconductor substrate, that is, from the peripheral edge side, than the other wire cemented elements. Therefore, the signal wire which interconnects the signal pad and the signal wire cemented element can be extended along the extension line of the straight line interconnecting the pad centers of the pad row.

There is no limitation to the position of the pads and the wire cemented elements for the power supply voltage and the reference voltage. However, since the signal pad and the signal wire cemented element which are spaced farthest from each other are connected to each other by the signal wire, wire bonding between the pads and the wire cemented elements for the power supply voltage and the reference voltage is carried out in a region on the inner side of the signal wire.

In a preferred form, the power supply voltage pad is positioned nearest to the peripheral edge side of the semiconductor substrate. In this instance, the reference voltage wire for interconnecting the reference voltage pad and the reference voltage wire cemented element is inevitably positioned between an application portion of the power supply voltage and an application portion of the signal. Therefore, the wire for the reference voltage which makes a return path for the signal runs in parallel to and just below the signal wire. Consequently, occurrence of potential interference and of crosstalk noise can be prevented.

According to another embodiment of the present invention, there is provided a semiconductor integrated circuit including a semiconductor substrate, a circuit formed on the semiconductor substrate, and a plurality of pads arranged in a linearly juxtaposed relationship with each other in a direction perpendicular to a peripheral edge side of the semiconductor substrate which is nearest to the pads on a main face of the semiconductor substrate and electrically connected to the circuit in a corresponding relationship to a signal, a power supply voltage and a reference signal, the signal pads for inputting and outputting the signal being arranged farthest from the peripheral edge side of the semiconductor substrate in each of rows of the pads in which the pads are juxtaposed linearly.

Preferably, the power supply voltage pad, reference voltage pad and signal pad in each pad row are arranged in order from the side nearer to the peripheral edge side of the semiconductor substrate.

Preferably, a plurality of pad rows are arranged along the peripheral edge side of the semiconductor substrate, and in the plural pad rows, a plurality of reference voltage pads are disposed at positions which surround three sides of one of the signal pads.

In summary, the embodiments of the present invention can provide a semiconductor device which implements a wire connection structure wherein crosstalk noise is less likely to be superposed on a path along which a signal is inputted or outputted even if high density arrangement is adopted.

The embodiments of the present invention can further provide a semiconductor integrated circuit which can be incorporated suitably in the semiconductor device.

BRIEF DESCRIPTION OF THE DRAWINGS

FIGS. 1A and 1B are a schematic plan view and a schematic cross sectional view, respectively, of a semiconductor device according to a first embodiment of the present invention;

DETAILED DESCRIPTION OF THE PREFERRED EMBODIMENTS

Figure 2A:
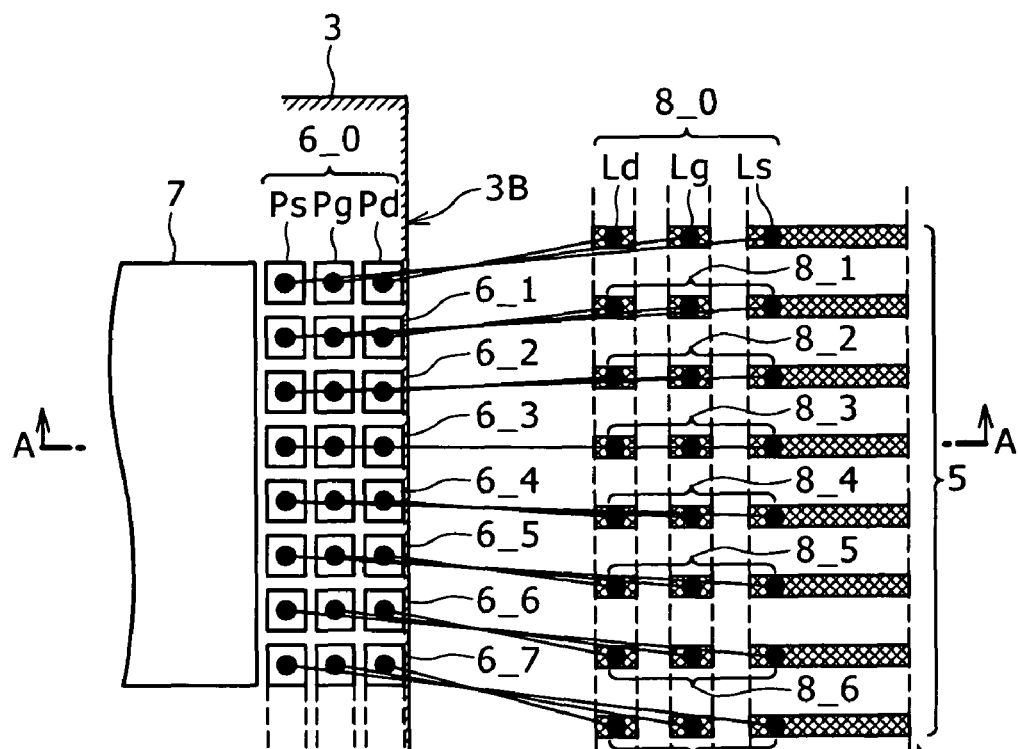
FIGS. 2A and 2B is an enlarged schematic plan view and an enlarged schematic cross sectional view, respectively, showing a wire connection portion of the semiconductor device shown in FIGS. 1A and 1B.

In the following, preferred embodiments of the present invention are described with reference to the accompanying drawings taking a case wherein a semiconductor chip is mounted on a printed circuit board through an interposer or interposed substrate as an example.

First Embodiment

FIG. 1A shows a plan view of a semiconductor device according to a first embodiment of the present invention, and FIG. 1B shows a cross sectional view taken along line A-A of FIG. 1A.

Referring to FIGS. 1A and 1B, the semiconductor device 1 shown includes a mounting substrate 2 called interposer and a semiconductor chip 3 as a semiconductor integrated circuit cemented at a rear face thereof to the mounting substrate 2.

The mounting substrate 2 has, at the portion thereof at which it is cemented to the semiconductor chip 3, a conductive layer of a large area called die pad. The semiconductor chip 3 has a semiconductor substrate such as a silicon substrate and has a circuit formed in high density on the surface of the semiconductor substrate using a semiconductor lithography technique. Meanwhile, the rear face of the semiconductor substrate normally has a rear face metal layer formed thereon. The rear face metal layer is electrically connected in low resistance to a body region of silicon in the main region of the semiconductor substrate. The semiconductor substrate or semiconductor chip 3 is firmly cemented electrically and mechanically at the rear face thereof to the die pad. In this instance, conductive paste or the like is used for the cementing.

It is to be noted that the rear face connection of the semiconductor chip 3 is not limited to the specific example described above but may include only the mechanical cementing.

The semiconductor chip 3 is formed by dicing a silicon wafer, on which the circuit is formed, into a rectangular shape, here into a square shape. A pad arrangement region 3A is provided along peripheral edge sides, that is, four sides of the outer periphery as viewed in plan, of the semiconductor chip 3.

External terminals 4 are disposed in two rows, for example, along each of the four sides of the outer periphery on the rear face of the mounting substrate 2. The external terminals 4 have, for example, a ball shape or a pellet shape such as a box shape or a cylindrical shape of solder or the like.

The external terminals 4 may be disposed arbitrarily and may be formed uniformly on the rear face of the mounting substrate 2. Where the mounting substrate 2 may have a comparatively large size, the external terminals 4 are frequently formed in a plurality of rows along the outer periphery of the mounting substrate 2 as seen in a see-through fashion in FIG. 1A.

Through-holes for connection to the external terminals 4 are formed in the mounting substrate 2 in such a manner as to extend through the mounting substrate 2 in the thicknesswise direction. The external terminals 4 are electrically connected through the through-holes to wiring lines on the upper face of the mounting substrate 2 to which the semiconductor chip 3 is cemented. Or, where the mounting substrate 2 is formed from a multi-layer substrate, the external terminals 4 are electrically connected to the wiring lines on the upper face of the mounting substrate 2, to which the semiconductor chip 3 is cemented, through via holes which interconnect wiring lines in the substrate and wiring lines in the different layers.

Lead wiring lines 5 are patterned on the upper face of the mounting substrate 2, more particularly, on the upper face of the mounting substrate 2 around the location at which the semiconductor chip 3 is die bonded, and are electrically connected to the corresponding external terminals 4. Where the mounting substrate 2 has a multilayer substrate structure, the lead wiring lines 5 shown in FIG. 1 include not only the patterns formed on the upper face of the mounting substrate 2 but also the patterns where the patterns in the inner layers are seen through.

An end portion of each lead wiring line 5 on the semiconductor chip side is called "land" because it makes a cemented portion or landed portion of a bonding wire. The land is hereinafter referred to as "wire cemented element."

In the semiconductor device 1 of FIG. 1, a wire connection structure for a semiconductor chip which has both of a high noise resisting property and a high arrangement efficiency, that is, arrangement of pads and lands (wire cemented elements) for wire bonding, and a connection structure by a wire, are proposed.

More particularly, a plurality of pads are arranged in a direction perpendicular to each peripheral edge side of the semiconductor chip 3. A plurality of pads arranged perpendicularly to each peripheral edge side of the semiconductor chip 3 in this manner is hereinafter referred to as "pad row." The pad row, which is, a plurality of pads, and a plurality of corresponding wire cemented elements are coupled to each other, for example, by substantially linear bonding wires, which do not contact with each other, by adjusting the height of the wires. To this end, at least signal pads and corresponding signal wire cemented elements are arranged characteristically in an opposing relationship to each other at the farthest positions from each other with reference to each peripheral edge side of the semiconductor chip 3. By the arrangement, a room in which pads and wire cemented elements for other power supply voltages and reference voltages are arranged linearly is produced on the inner side of the signal pads and the signal wire cemented elements. Therefore, such substantially linear bonding as described above can be achieved.

FIG. 2A shows, in an expanded scale, a region along one side of the semiconductor chip 3 of FIG. 1 and associated portions. Meanwhile, FIG. 2B shows a cross section of the mounting substrate taken along line A-A of FIG. 2A.

Figure 2B:
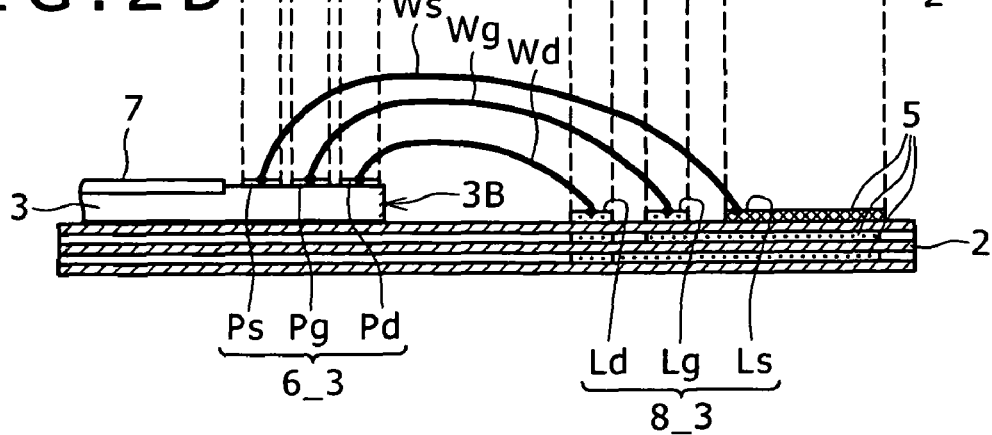

Referring to FIGS. 2A and 2B, the pad arrangement region 3A (refer to FIGS. 1A and 1B) has three bands of pads arranged along each peripheral edge side 3B of the semiconductor chip 3. Consequently, three different kinds of pads juxtaposed in a direction perpendicular to the peripheral edge side 3B of the semiconductor chip 3, in particular, a signal pad Ps, a ground (GND) pad Pg as a "reference voltage pad" and a VDD (Voltage Drain Drain) pad Pd as a "power supply voltage pad," form one pad row $6\_i$ (i=0 to 7). Here, as a condition which must be satisfied to a minimum with regard to the pad arrangement in the present embodiment, the signal pad Ps is positioned farthest from the peripheral edge side 3B. Although the ground pad Pg and the VDD pad Pd may be arranged reversely, in order to reinforce a return path for a signal, such pad arrangement as seen in FIGS. 2A and 2B is preferable.

The pads in the plural pad rows are connected to corresponding IO portions in the circuit 7 formed on the semiconductor substrate such that a signal, a power supply voltage and a reference voltage can be inputted and outputted therethrough. It is to be noted that, although the circuit 7 shown in FIGS. 2A and 2B are positioned adjacent the pad rows, the circuit 7 may otherwise be positioned just below the pad rows.

In a corresponding relationship to the pad rows, also the wire cemented elements on the mounting substrate 2 side are arranged in rows in a direction perpendicular to the peripheral edge side 3B. In particular, a VDD land Ld as a "power supply voltage wire cemented element," a ground land Lg as a "reference voltage wire cemented element" and a signal land Ls arranged in order from the peripheral edge side 3B form one land row $8\_i$ (i=0 to 7). Here, the "land row" signifies a "row of wire cemented elements."

It is to be noted that, although the mounting substrate 2 shown in FIG. 2B has a multilayer substrate structure, it may have another structure that the patterns of the lead wiring lines 5 shown in FIG. 1A are formed on a single layer substrate.

In the present embodiment, the VDD lands Ld and the ground lands Lg are arranged on individually different lines parallel to the peripheral edge side 3B. However, the individual lands are separated from each other in a pattern.

Referring to FIG. 2B, each signal wire Ws is cemented at one end thereof to a signal pad Ps and at the other end thereof to a signal land Ls to establish electric connection between the signal pad Ps and the signal land Ls. Meanwhile, a ground pad Pg and a ground land Lg are connected to each other by a ground wire Wg as a "reference voltage wire." Similarly, a VDD pad Pd and a VDD land Ld are connected to each other by a VDD wire Wd as a "power supply voltage wire."

The connection of the pads and the lands is similar also with regard to the other pad rows and land rows.

In the wire bonding structure of the pad rows and the land rows, as representatively shown in FIG. 2B, the signal wire Ws has the greatest wire height and the VDD wire Wd has the smallest wire height while the ground wire Wg has a substantially medium wire height. The distance between the wires as viewed in section is substantially fixed.

In the pad row $6\_3$ corresponding to the line A-A, the three wires, that is, the signal wire Ws, ground wire Wg and VDD wire Wd overlap fully linearly with each other as viewed in plan.

However, in the arrangement of FIG. 2A, the pitch of the lands or wire cemented elements in a direction parallel to the peripheral edge side of the semiconductor chip 3 is a little greater than the pitch of the pads in the direction. Therefore, as the distance from the pad row $6\_3$ increases, although the three wires in a different row generally overlap with each other on a straight line, strictly they are displaced by an increasing amount from a straight line such that they intersect with each other by a small but increasing angle. Further, since some fabrication dispersion exists in the bonding positions and the tensions of the wires, in a strict sense, three wires in a row rather seldom overlap with each other on a fully straight line.

One of characteristics of the present embodiment resides in that "a plurality of wires are arranged in different loop heights along a direction of an extension line of a straight line which interconnects the centers of the pads in each pad row." The "along a direction of an extension line of a straight line" does not necessarily signify that the wires overlap on a fully straight line. The term signifies that the wires are formed so as to roughly draw a straight line. Therefore, in the present embodiment, it is permitted that the wires make a small angle relative to each other due to the difference in pitch described above or the wires do not overlap linearly due to dispersion in fabrication.

Such fabrication dispersion as just described is permitted also as a cause in that the distance between the wires in a cross section is not strictly fixed.

With the wire connection structure according to the present embodiment, since the ground wire Wg is arranged just below the signal wire Ws, the loop inductor of the signal wiring line is reduced, and the transmission characteristic of a signal, that is, the characteristic that a signal is transmitted smoothly, is enhanced. As a result, crosstalk is suppressed. This advantage enhances particularly as the driving frequency increases.

In summary, with the wire connection structure of the present embodiment, achievement of both of prevention or suppression of crosstalk noise and high density arrangement of pads and so forth can be anticipated.

Second Embodiment

Figure 3A:
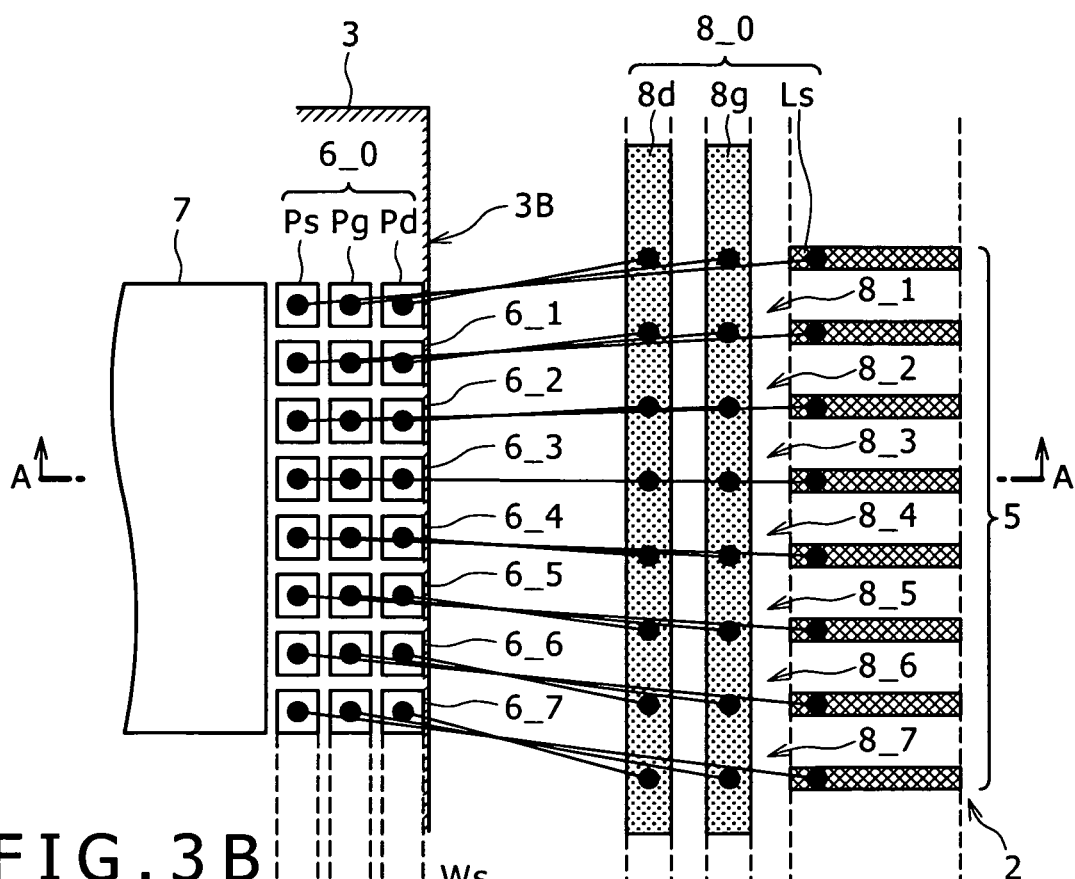
FIGS. 3A and 3B is an enlarged schematic plan view and an enlarged schematic cross sectional view, respectively, showing a wire connection portion of a semiconductor device according to a second embodiment of the present invention.
Figure 3B:
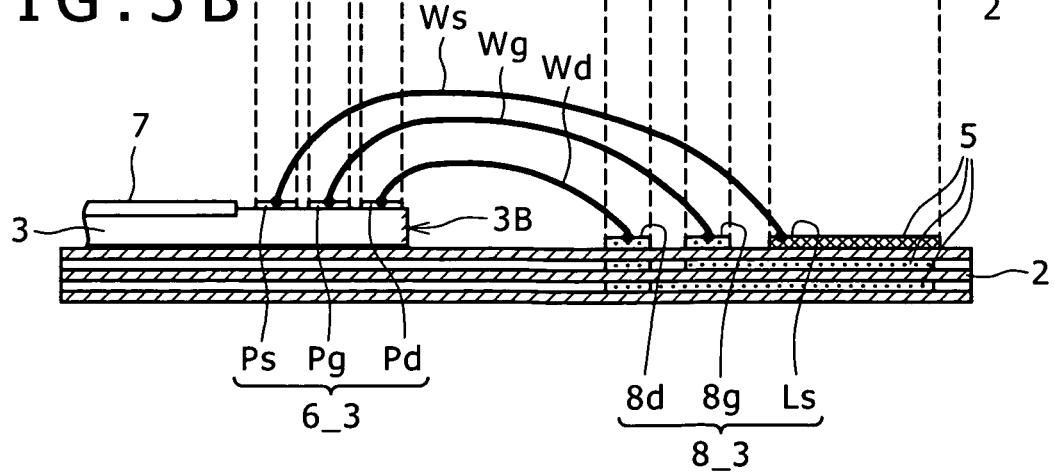

FIG. 3A shows, in an expanded scale, a region along one side of the semiconductor chip 3 of FIG. 1 and associated portions. Meanwhile, FIG. 3B shows a cross section of the mounting substrate taken along line A-A of FIG. 3A. FIGS. 3A and 3B show a semiconductor device according to a second embodiment of the present invention.

Referring to FIGS. 3A and 3B, in the wire connection structure according to the second embodiment shown, a plurality of pads, that is, a signal pad Ps, a ground pad Pg and a VDD pad Pd, are arranged in a direction perpendicular to a peripheral edge side 3B of a semiconductor chip 3 similarly as in the semiconductor device of FIGS. 1A and 1B. In this instance, the signal pad Ps is disposed on the innermost side of the semiconductor chip 3, that is, adjacent the circuit 7. In a corresponding relationship to this, the signal land Ls as a "signal wire cemented element" is arranged at a position farthest from the semiconductor chip 3, that is, from the peripheral edge side 3B.

The arrangement of the signal pad Ps, ground pad Pg and VDD pad Pd described is common between the wire connection structures in the first and second embodiments.

In FIG. 2A which shows the wire connection structure of the first embodiment, the VDD lands Ld and the ground lands Lg are provided in an individually isolated manner from each other among the land rows 8_i.

In contrast, in the wire connection structure of the second embodiment, a VDD line 8d is provided which interconnects the VDD lands Ld shown in FIG. 2A like a belt extending in parallel to the peripheral edge side 3B as seen in FIG. 3A. Further, a ground line 8g is provided which interconnects the ground lands Lg shown in FIG. 2A like a belt extending in parallel to the peripheral edge side 3B.

Where the entire arrangement is viewed on a general view like FIG. 1, the lines 8d and 8g form a pattern like double rings surrounding the semiconductor chip 3.

However, if attention is paid to one pad row, a "row of wire cemented elements," in the arrangement shown in FIG. 3A, a land row 8_i including a VDD line 8d, a ground line 8g and a signal land Ls is disposed on an extension line of a straight line which interconnects the pad centers of the pad row similarly.

Therefore, similar bonding wherein wires are superposed on a substantially straight line to that in the first embodiment can be achieved.

Similarly as in the first embodiment, wiring is carried out such that the height is suppressed by a greater amount on the outer side of the semiconductor chip 3 so that the wires may not contact with each other even on the same straight line. Further, the second embodiment exhibits an advantage of increase of the number of pads similarly as in the first embodiment. Since the ground wire Wg exists just below the signal wire Ws, the loop inductance of the signal wiring line decreases.

The second embodiment achieves, in addition to the advantages described above, an advantage that, since the wiring line capacitance of the VDD line 8d and the ground line 8g is high, a sudden potential variation is absorbed. Therefore, there is an advantage that the location held by the power supply voltage or the reference voltage, that is, the ground voltage, suppresses generation of crosstalk noise from the location itself.

Therefore, the second embodiment is advantageous in that it is less likely to be influenced by crosstalk noise from a neighboring signal while generation of crosstalk noise is suppressed and the noise reduction characteristic of the signal can be enhanced from that of the first embodiment.

Third Embodiment

Figures 4A, 4B:
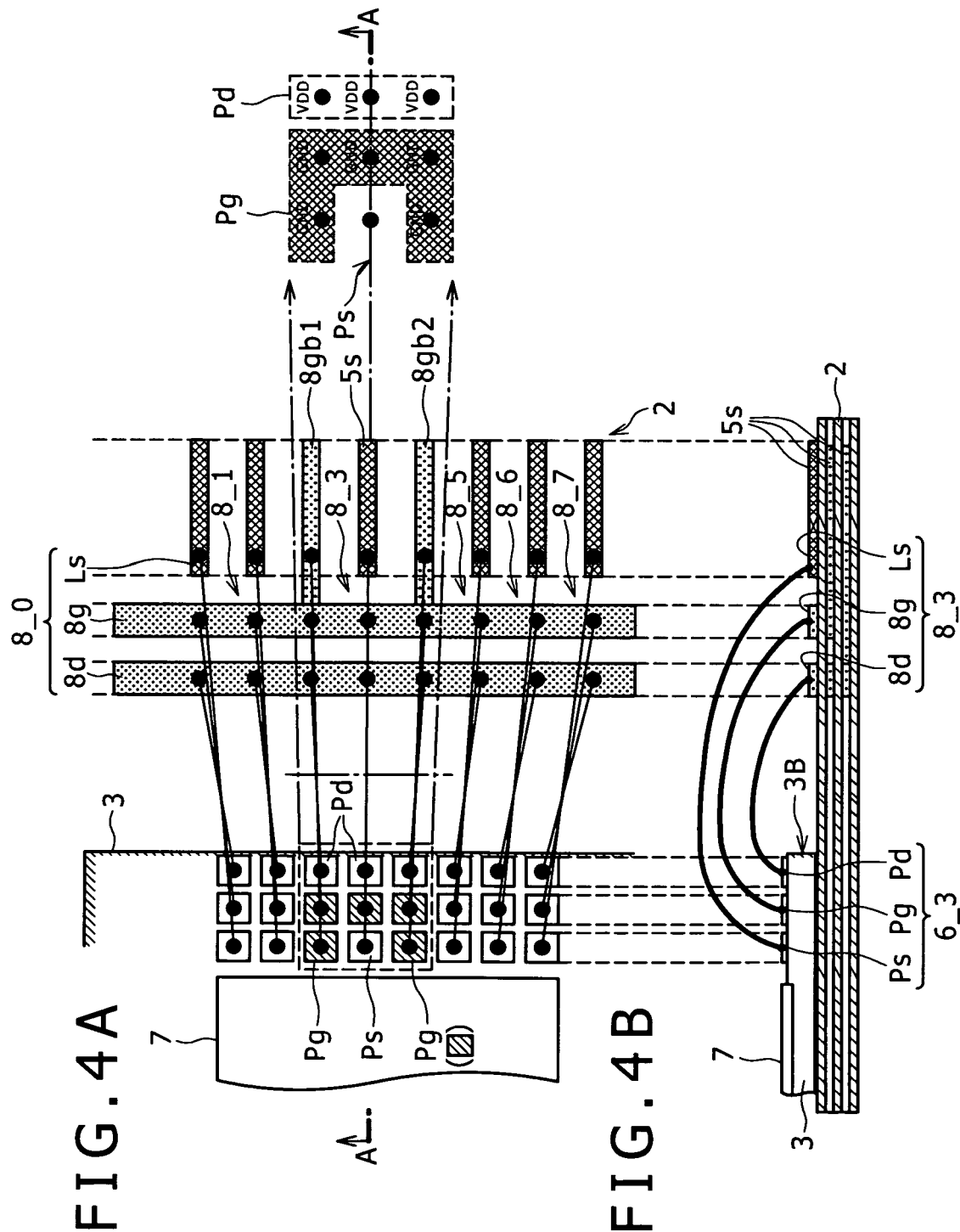
FIGS. 4A and 4B is an enlarged schematic plan view and an enlarged schematic cross sectional view, respectively, showing a wire connection portion of a semiconductor device according to a third embodiment of the present invention.

FIG. 4A shows, in an expanded scale, a region along one side of the semiconductor chip 3 of FIG. 1 and associated portions. Meanwhile, FIG. 4B shows a cross section of the mounting substrate taken along line A-A of FIG. 4A. FIGS. 4A and 4B show a semiconductor device according to a third embodiment of the present invention which is a partial modification to the second embodiment of FIGS. 3A and 3B.

The wire connection structure of the third embodiment shown in FIGS. 4A and 4B is different in the following points from that of the second embodiment described hereinabove with reference to FIGS. 3A and 3B.

Usually, such a very important signal as a clock signal is shielded from noise from other signals by means of a shield wiring line laid in parallel or the like. However, an existing wire bonding portion cannot be shielded fully by the ground shield wiring line therearound.

For an important signal, a pad row is utilized for the shield without providing, for pad rows around the pad row, a signal pad Ps to which some other signal is allocated.

For example, referring to FIG. 4A, two pads which neighbor with and are positioned on the opposite sides with respect to a signal pad Ps, to which an important signal is allocated, in a direction parallel to the peripheral edge side 3B are used as ground pads Pg. The two pads on the opposite sides of the ground pad Pg in the pad row same as that of the signal pad Ps are both formed as ground pads Pg from the beginning. Therefore, a shield structure for surrounding the signal pad Ps, to which an important signal is allocated, on the three sides with the ground potential is formed. Since this shield structure is maintained similarly also during bridging by the wire, noise does not jump into the important signal. In short, particularly with regard to this signal, crosstalk noise can be reduced by a greater amount than that of any other signal involved in the first and second embodiments, and consequently, the S/N ratio of the signal can be increased.

Preferably, a ground wiring line is formed also on the opposite sides of a lead wiring line 5s along which the important signal is transmitted as seen from the mounting substrate 2 side shown in FIG. 4A.

More particularly, two branch lines 8gb1 and 8gb2 branching from the ground line 8g are wired in parallel to the lead wiring line 5s. For the wiring line space of the branch lines, the land rows 8_2 and 8_4 which are formed on the opposite sides in the arrangement of FIGS. 2A and 3A are not formed. However, since, also at the pad portions on the semiconductor chip 3 side corresponding to the opposite side portions, the pads which should originally serve as signal pads are sacrificed by the addition of the ground pads Pg, there is no necessity to form the land rows 8_2 and 8_4. In short, the space which becomes useless on the mounting substrate 2 side as a result of the formation of the shield structure by the pad on the semiconductor chip 3 is utilized effectively to form the branch lines 8gb1 and 8gb2.

Where the branch lines are formed in this manner, a full shielding performance can be achieved over the entire wire connection structure shown in FIGS. 4A and 4B.

Fourth Embodiment

Figure 5A:
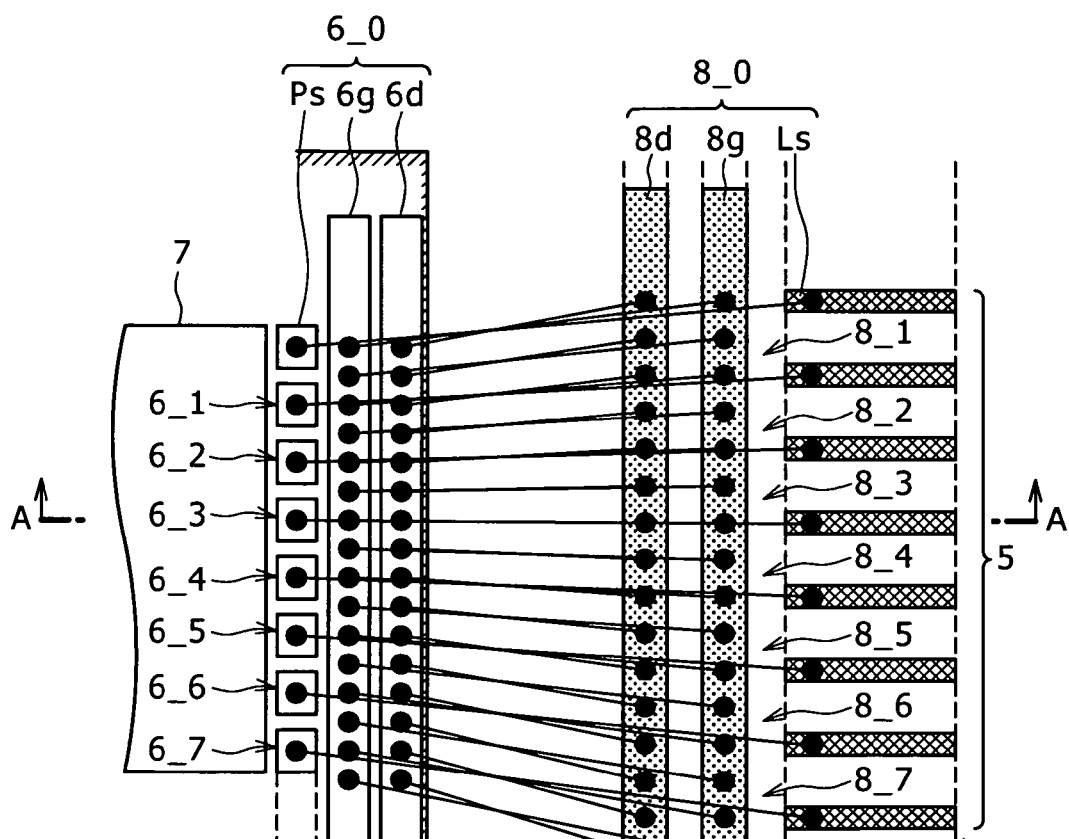
FIGS. 5A and 5B is an enlarged schematic plan view and an enlarged schematic cross sectional view, respectively, showing a wire connection portion of a semiconductor device according to a forth embodiment of the present invention.
Figure 5B:
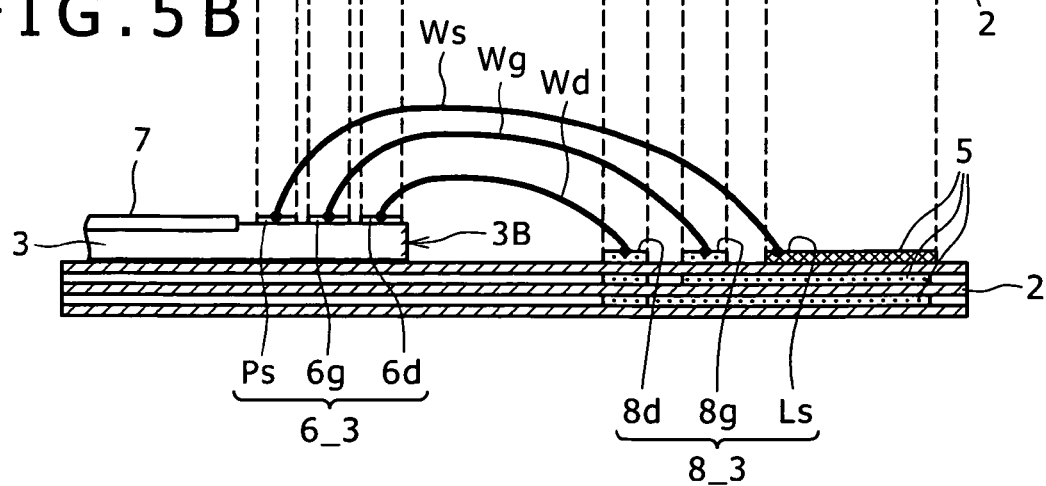

FIG. 5A shows, in an expanded scale, a region along one side of the semiconductor chip 3 of FIG. 1 and associated portions. Meanwhile, FIG. 5B shows a cross section of the mounting substrate taken along line A-A of FIG. 5A. FIGS. 5A and 5B show a semiconductor device according to a fourth embodiment of the present invention which is partial modification to the third embodiment of FIGS. 3A and 3B. Such modification as just mentioned can be applied similarly also to the arrangement of FIGS. 2A, 2B and 4A, 4B. Here, as an example, the modification to the second embodiment is described as a fourth embodiment of the present invention.

The ground pads Pg and the VDD pads Pd disposed on the outer periphery side of the semiconductor chip 3 exhibit a substantially same potential between adjacent ones thereof. Therefore, even if the ground pads Pg or the VDD pads Pd are connected to each other to form a ring, no problems occur with operation of them.

In the present embodiment, as seen in FIG. 5A, those pads adjacent each other for the power supply of the same potential or the ground are connected to each other to form a belt-like line or a ring-shaped line such as a VDD line 6d and a ground line 6g. By the arrangement, an effect of reducing the impedance of the power supply lines in the semiconductor chip 3 can be anticipated.

In the example of FIGS. 5A and 5B, since also the power supply lands and the ground lands on the interposer side form ring-shaped or belt-shaped land lines, that is, the ground line 8g and the VDD line 8d, a signal wire Ws and a ground wire Wg can be additionally provided freely at locations other than the location just below the signal wire. Consequently, further reinforcement of the noise countermeasure of making it less likely for the power supply lines or the ground lines to be fluctuated by noise can be achieved.

It is to be noted that such addition of a signal wire Ws or a ground wire Wg is possible also in the arrangement of FIGS. 3A and 3B or 4A and 4B.

<Modifications>

The first to fourth embodiments can be arbitrarily combined freely.

Further, the embodiments described above relate to a case wherein the interposer is an example of the mounting substrate. However, the semiconductor integrated circuit, that is, the semiconductor chip 3, may be mounted directly on a printed circuit board. In this instance, the arrangement of the wire cemented elements described above is formed on the printed circuit board. Here, the printed circuit board is an example of the "mounting substrate." Also it is possible to mount the semiconductor chip 3 on a small-sized printed circuit board, on which the wire cemented elements are arranged, to form a module and mount the module on a mother board. In this instance, the small-sized printed circuit board for forming the module is an example of the "mounting substrate."

While, in the foregoing description, advantages of the embodiments are described suitably, advantages where the embodiments described above are compared with related art flip chip mounting or zigzag-star arrangement of pads are described below.

One of available solutions to shortage of pads is flip chip mounting. This is a mounting technique of turning over a semiconductor chip 3 on which pads are arranged in a two-dimensional array and connecting the semiconductor chip 3 to a mounting substrate such as, for example, an interposer, using bumps or the like.

In a connection method between pads and a mounting substrate using a wire, it is necessary to arrange the pads at peripheral edge portions of a semiconductor chip. In contrast, in the flip chip mounting, the number of pads can be increased freely because it is free from the restriction. Further, the flip chip mounting can reduce crosstalk noise between adjacent signals in comparison with mounting which uses wire bonding and exhibits less characteristic deterioration even if the pad density is raised.

From the foregoing, there is no doubt in that, in order to eliminate shortage of the pad number, the flip chip mounting is one of solutions. However, in the flip chip mounting, it is necessary to draw an interposer to be connected in accordance with a wiring line rule of the same level as the pad pitch of the semiconductor chip, and increase of the cost for the package cannot be avoided. Particularly in the case of a product for low end users, the increase of the cost cannot be accepted, and therefore, mounting by wire bonding is adopted frequently. Even with a product for high end users, where they have such a structure that a plurality of semiconductor chips are stacked vertically, the flip chip mounting cannot be adopted originally.

From the foregoing reason, the demand to solve the problem of shortage of pads while using wire bonding mounting is strong.

On the other hand, as a method of increasing the number of pads while adopting the wiring bonding mounting, a method of arranging pads in a zigzag-star pattern can be adopted. However, even if this method is adopted, the number of pads can be increased only to twice in the maximum. Further, in order to arrange pads in a zigzag-star pattern, to which pads a signal, the power supply voltage and the ground voltage should be allocated must be determined from both of the semiconductor chip designer side and the interposer designer side. This gives rise to increase of the design period. Further, as a problem regarding the property, since the distance between adjacent wires decreases, crosstalk noise increases.

According to the embodiments of the present invention, a wire connection structure which is advantageous in reduction of crosstalk noise which cannot be achieved by the arrangement wherein unit pads are arranged perpendicularly to the peripheral edge side 3B can be provided.

From the foregoing, the number of pads for wire bonding can be increased. Further, since a wire to which a power supply voltage or a reference voltage such as the ground voltage is applied extends just below a signal wire, the loop impedance between the signal and the power supply voltage and between the signal and the reference voltage or ground voltage can be reduced, resulting in improvement of the signal quality. Further, where neighboring pads are used as shield wiring lines, mounting of shields which are very tough also for the wire portions can be facilitated. Furthermore, where a shield structure is formed also on the mounting substrate side using branch lines, a substantially full shield effect can be achieved.

The present application contains subject matter related to that disclosed in Japanese Priority Patent Application JP 2008-169513, filed in the Japan Patent Office on Jun. 27, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit, comprising:
   a semiconductor substrate;
   a circuit formed on the semiconductor substrate; and
   a plurality of pads arranged in a linearly juxtaposed relationship with each other in a direction perpendicular to a peripheral edge side of the semiconductor substrate which is nearest to the pads on a main face of the semiconductor substrate and electrically connected to the circuit in a corresponding relationship to a signal, a power supply voltage and a reference signal; wherein
   the signal pads for inputting and outputting the signal being arranged farthest from the peripheral edge side of the semiconductor substrate in each of rows of the pads in which the pads are juxtaposed linearly.

2. The semiconductor integrated circuit according to claim 1, wherein
the power supply voltage pad, reference voltage pad and signal pad in each pad row are arranged in order from the side nearer to the peripheral edge side of the semiconductor substrate.

3. The semiconductor integrated circuit according to claim 1, wherein
a plurality of pad rows are arranged along the peripheral edge side of the semiconductor substrate, and
in the plural pad rows, a plurality of reference voltage pads are disposed at positions which surround three sides of one of the signal pads.

4. A semiconductor device, comprising:
a semiconductor substrate having a circuit formed thereon;
a mounting substrate cemented to a rear face of the semiconductor substrate;
a plurality of pads arranged in a linearly juxtaposed relationship with each other in a direction perpendicular to a peripheral edge side of the semiconductor substrate which is nearest to the pads on a main face of the semiconductor substrate and electrically connected to the circuit in a corresponding relationship to a signal, a power supply voltage and a reference signal;
a plurality of wires individually cemented at one end thereof to the pads; and
a plurality of wire cemented elements formed on the mounting substrate and cemented to the other end of the wires; wherein
the signal pads for inputting and outputting the signal being arranged farthest from the peripheral edge side of the semiconductor substrate in each of rows of the pads in which the pads are juxtaposed linearly,
the signal wire cemented elements for inputting and outputting the signal from among the wire cemented elements being arranged at a position on the mounting substrate which is positioned farther from the semiconductor substrate than the other wire cemented elements.

5. The semiconductor device according to claim 4, wherein
the wires for connecting the pads and the wire cemented elements in a one-by-one corresponding relationship to each other bridge the pads and the wire cemented elements in different loop heights thereamong.

6. The semiconductor device according to claim 5, wherein
the wires are arranged in different loop heights along a direction of an extension line of a straight line which interconnects the centers of the pads in each pad row.

7. The semiconductor device according to claim 4, wherein
the power supply voltage pad, reference voltage pad and signal pad in each pad row are arranged in order from the side nearer to the peripheral edge side of the semiconductor substrate, and
the power supply voltage wire cemented element, reference voltage wire cemented element and signal wire cemented element to be electrically connected to the power supply voltage pad, reference voltage pad and signal pad, respectively, in each pad row individually by wires are positioned so as to be farther in order from the peripheral edge side of the semiconductor substrate.

8. The semiconductor device according to claim 7, wherein
the wires for connecting the pads and the wire cemented elements in a one-by-one corresponding relationship to each other bridge the pads and the wire cemented elements in different loop heights thereamong, and the wires for propagating the signal, reference potential and power supply voltage are arranged in a descending order of the loop height.

9. The semiconductor device according to claim 8, wherein
the wires are arranged in different loop heights along a direction of an extension line of a straight line which interconnects the centers of the pads in each pad row.

10. The semiconductor device according to claim 7, wherein
a plurality of pad rows are arranged along the peripheral edge side of the semiconductor substrate, and
the power supply voltage wire cemented elements and the reference voltage wire cemented elements are individually formed as a single belt-shaped conductive layer common to the plural pad rows on the mounting substrate.

11. The semiconductor device according to claim 10, wherein
a plurality of pad rows are arranged along the peripheral edge side of the semiconductor substrate, and
in the plural pad rows, a plurality of reference voltage pads are disposed at positions which surround three sides of one of the signal pads.

12. The semiconductor device according to claim 11, wherein
the signal wire cemented element is surrounded on the three sides thereof by the reference voltage wire cemented element formed from a single belt-shaped conductor layer and two branch portions branching from the reference voltage wire cemented element.

13. The semiconductor device according to claim 7, wherein
a plurality of pad rows are arranged along the peripheral edge side of the semiconductor substrate, and
in the plural pad rows, a plurality of reference voltage pads are disposed at positions which surround three sides of one of the signal pads.

* * * * *